US009891842B2

(12) United States Patent
Crawford, Jr.

(10) Patent No.: US 9,891,842 B2
(45) Date of Patent: Feb. 13, 2018

(54) SEARCHING DATA IN PARALLEL USING PROCESSOR-IN-MEMORY DEVICES

(71) Applicant: Micron Technology, Inc., Boise, ID (US)

(72) Inventor: Isom Lawrence Crawford, Jr., Royse City, TX (US)

(73) Assignee: Micron Technology, Inc., Boise, ID (US)

( * ) Notice: Subject to any disclaimer, the term of this patent is extended or adjusted under 35 U.S.C. 154(b) by 150 days.

(21) Appl. No.: 14/847,807

(22) Filed: Sep. 8, 2015

(65) Prior Publication Data

US 2017/0068464 A1 Mar. 9, 2017

(51) Int. Cl.
G06F 3/06 (2006.01)
G06F 17/30 (2006.01)
H03M 7/30 (2006.01)
G06F 12/02 (2006.01)

(52) U.S. Cl.
CPC .......... *G06F 3/0613* (2013.01); *G06F 3/0644* (2013.01); *G06F 3/0653* (2013.01); *G06F 3/0673* (2013.01); *G06F 12/02* (2013.01); *G06F 17/30982* (2013.01); *H03M 7/3086* (2013.01)

(58) Field of Classification Search
None
See application file for complete search history.

(56) References Cited

U.S. PATENT DOCUMENTS

| 5,329,405 A * | 7/1994 | Hou .......................... G06F 7/02 365/189.07 |
| 5,678,021 A | 10/1997 | Pawate et al. |
| 5,751,987 A | 5/1998 | Mahant-Shetti et al. |
| 6,301,164 B1 | 10/2001 | Manning et al. |
| 6,466,499 B1 | 10/2002 | Blodgett |
| 6,950,898 B2 | 9/2005 | Merritt et al. |
| 7,260,672 B2 | 8/2007 | Garney |
| 7,546,438 B2 | 6/2009 | Chung |
| 8,042,082 B2 | 10/2011 | Solomon |
| 8,279,683 B2 | 10/2012 | Klein |
| 2001/0010057 A1 | 7/2001 | Yamada |
| 2003/0222879 A1 | 12/2003 | Lin et al. |
| 2009/0254694 A1* | 10/2009 | Ehrman ............... G11C 7/1006 711/100 |

(Continued)

OTHER PUBLICATIONS

Dybdahl, et al., #Destructive-Read in Embedded DRAM, Impact on Power Consumption, Apr. 2006, (10 pgs.), vol. 2, Issue 2, Journal of Embedded Computing-Issues in embedded single-chip multicore achitectures.

(Continued)

*Primary Examiner* — Edward Dudek, Jr.
*Assistant Examiner* — Ralph A Verderamo, III
(74) *Attorney, Agent, or Firm* — Fletcher Yoder, P.C.

(57) ABSTRACT

A method includes comparing, in parallel, a data pattern with data stored into a plurality of columns of memory cells, and in response to detecting the data pattern in the data stored into a particular column of memory cells of the plurality of columns of memory cells, storing in a memory cell of the particular column a value indicative of at least one of an occurrence of the data pattern or a position of the data pattern in the data stored into the particular column.

17 Claims, 6 Drawing Sheets

(56) References Cited

U.S. PATENT DOCUMENTS

2009/0254697 A1* 10/2009 Akerib .............. G11C 7/1006
                                                   711/105
2011/0093662 A1   4/2011 Walker et al.
2011/0119467 A1   5/2011 Cadambi et al.
2013/0003467 A1   1/2013 Klein
2014/0250279 A1   9/2014 Manning

OTHER PUBLICATIONS

Kogge, et al, "Processing in Memory: Chips to Petaflops, "May 23, 1997, (8pgs.), retrieved from: http://www.cs.ucf.edu/courses/cda5106/summer02/papers/kogge97PIM.pdf.

Draper, et al., "The Architecture of the DIVA Processing-in-Memory Chip, "Jun. 22-26, 2002, (12 pgs.), ICS 02, retrieved from: http://www.isi.edu/-draper/papers/ics2.pdf.

Adibi, et al., "Processing-In-Memory Technology for Knowledge Discovery Algorithms, "Jun. 25, 2006, (10pgs.), Proceeding of the Second International Workshop on Data Management on New Hardware, retrieved from: http://www.cs.cmu.edu/-damon2006/pdf/adibi06inmemory.pdf.

U.S. Appl. No. 13/449,082, filed Apr. 17, 2012.
U.S. Appl. No. 13/743,686, filed Jan. 17, 2013.
U.S. Appl. No. 13/774,553, filed Feb. 22, 2013.

* cited by examiner

US 9,891,842 B2

SEARCHING DATA IN PARALLEL USING PROCESSOR-IN-MEMORY DEVICES

BACKGROUND

Field of Invention

Embodiments of the invention relate generally to memory devices, and more specifically, to searching data in parallel using processor-in-memory (PIM) devices.

Description of Related Art

Integrated circuit designers often desire to increase the level of integration or density of elements within an integrated circuit by reducing the size of the individual elements and by reducing the separation distance between neighboring elements. In addition, integrated circuit designers often desire to design architectures that may be not only compact, but offer performance advantages, as well as simplified designs. One example of a common integrated circuit element may be a transistor, which may be found in many devices, such as memory circuits, processors, and the like. A typical integrated circuit transistor may include a source, a drain, and a gate formed at the surface of the substrate.

A relatively common integrated circuit device may be a memory device. There may be many different types of memory devices including, for example, volatile and non-volatile memory. Volatile memory devices may include random access memory (RAM), dynamic random access memory (DRAM), static random access memory (SRAM), synchronous dynamic random access memory (SDRAM), and thyristor random access memory (TRAM), and similar volatile memory devices. On the other hand, non-volatile memory devices include NAND flash memory, NOR flash memory, as well as resistance and magnetic based memory devices such as phase change random access memory (PCRAM), resistive random access memory (RRAM), magnetoresistive random access memory (MRAM), spin torque transfer random access memory (STT RAM), and other similar nonvolatile memory devices.

Electronic systems often include a number of processing resources (e.g., one or more processors), which may retrieve and execute instructions and store the results of the executed instructions to a suitable location. A processor may include number of functional units and similar circuitry to execute instructions by performing a number of operations. In many instances, these processing resources (e.g., functional units) may be external to the memory devices, in which data may be accessed via a bus between the processing resources and the memory devices to execute a set of instructions. This may lead to unnecessarily longer delays and increased power consumption in the processing and executing of the instructions. Furthermore, when performing text searches and/or data inquiries of data stored in the memory, these delays and increases in power consumption may be exacerbated, particularly when attempting to perform text searches of multiple documents and/or pages of data at once. It may be useful to provide devices and methods to increase processing efficiency and decrease power consumption when performing such text or data searches.

DETAILED DESCRIPTION

Present embodiments relate to a processor-in-memory (PIM) device and methods useful in providing a high-performance search (e.g., scan) for one or more data patterns within data streams (e.g., sequences) stored into columns of the PIM device. Indeed, the PIM device may include, for example, a two-dimensional (2D) array of memory cells that may be used to store bits of data, in which the array of memory cells may be arranged with thousands of columns and hundreds of rows, for example. The PIM device may then execute one or more arithmetic functions and/or Boolean logical operations (e.g., AND, OR, NOT, and so forth) to concurrently compare a number of digits of a data pattern (e.g., which may include a pattern, a sub-pattern, a sequence, or a sub-sequence) to data stored into a plurality of columns of memory cells of the array of the PIM device to detect an occurrence and/or a position of the data pattern in the data stored into the plurality of columns (which may be referred to by example hereinafter as finding a "match" or detecting a "hit").

For example, the PIM device may execute the comparison in parallel across all columns of the array, and store the results of the comparison into a success indicator row of the array. In this way, the results of the search may be provided for the data stored into the corresponding column of the success indicator row, and may thus allow the comparison and search of, for example, thousands or millions of data streams (e.g., emails, text, text messages, text documents, text files, script files, text strings, compressed files, webpages, records, binary data, binary files, and so forth) in parallel (e.g., concurrently).

It should be appreciated that as used herein, "row" may refer to at least one axis of an array of cells (e.g., memory cells). Similarly, "column" may refer to at least one other axis of the array of cells (e.g., memory cells) that may intersect and/or extend in a direction perpendicular to the row axis. Indeed, the "rows" and the "columns" may be respectively understood to refer to any one of at least two axes, in which the two axes are substantially perpendicular. In other words, the "rows" may or may not necessarily be horizontal, and the "columns" may or may not be necessarily vertical, and vice-versa. Furthermore, a "row of accumulators" may refer to a row of memory cells within an array of memory cells that may be designated and/or used to store the results or partial results of one or more performed arithmetic functions and/or logical operations. Similarly, a "row of accumulators" may, in some embodiments, refer to dedicated circuitry that may be included as part of a memory device and may be used to store the results or partial results of one or more performed arithmetic functions and/or logical operations.

Figure 1:
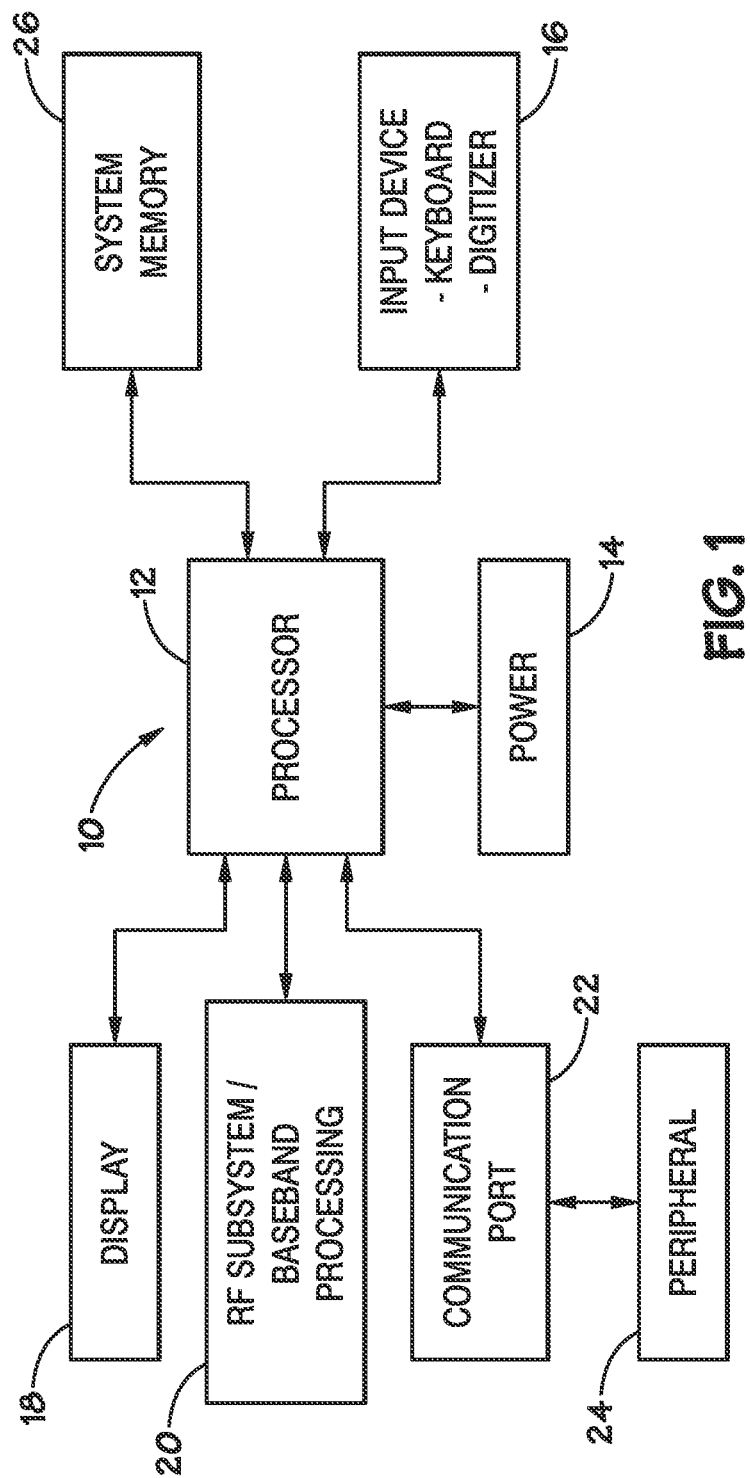
FIG. 1 illustrates a block diagram of a system including a memory device, in accordance with an embodiment.

With the foregoing in mind, it may be useful to describe an embodiment of a processor-based system, such as the processor-based system 10 illustrated in FIG. 1. The processor-based system 10 may include any of various electronic devices such as, for example, computers, tablet computers, pagers, mobile phones, personal organizers, portable audio players, cameras, watches, industrial measurement electronic devices, and so forth. As illustrated, the processor-based system 10 may include a processor 12. The processor 12 (e.g., microprocessor) may be provided to control the processing of system functions and requests in the system 10. Further, the processor 12 may include a number of processors that share system control.

The processor-based system 10 may also include a power supply 14. For example, if the processor-based system 10 may be a portable system, the power supply 14 may include permanent batteries, replaceable batteries, and/or rechargeable batteries. The power supply 14 may also include an alternating current (AC) adapter, such that the processor-based system 10 may receive power from, for example, a wall outlet or other AC power source. The power supply 14 may also include a direct current (DC) adapter such that the processor-based system 10 may receive power from, for example, a DC power source.

Various other devices may be coupled to the processor 12 depending on the functions that the processor-based system 10 performs. For example, in certain embodiments, an input device 16 may be coupled to the processor 12. The input device 16 may include, for example, buttons, switches, a keyboard, a light pen, a stylus, a mouse, and/or a voice recognition system. The system 10 may also include a display 18, which may be coupled to the processor 12. The display 18 may include a liquid crystal display (LCD), a cathode ray tube (CRT), organic light emitting diode displays (OLEDs), and/or various other display technologies.

Furthermore, as further illustrated, the system 10 may include a RF sub-system/baseband processor 20 that may be coupled to the processor 12. In one embodiment, the RF sub-system/baseband processor 20 may include one or more transceivers that may be useful in allowing the system 10 to communicate wirelessly. A communications port 22 may also be coupled to the processor 12. The communications port 22 may be adapted to be coupled to one or more peripheral devices 24 such as, for example, a modem, a printer, a computer, or to a network, such as a local area network, remote area network, intranet, or the Internet.

In certain embodiments, such as where the processor 12 may be used to control the functioning of the processor-based system 10 by executing instructions, a system memory 26 may be used to allow the processor 12 to efficiently carry out its functionality. As depicted, the system memory 26 may be coupled to the processor 12 to store and facilitate execution of various instructions. The system memory 26 may include volatile memory such as, for example, random access memory (RAM), dynamic random access memory (DRAM), static random access memory (SRAM), synchronous dynamic random access memory (SDRAM), and/or thyristor random access memory (TRAM).

The system memory 26 may also include non-volatile memory such as, for example, read-only memory (ROM), EEPROM, NAND flash memory, NOR flash memory, phase change random access memory (PCRAM), resistive random access memory (RRAM), magnetoresistive random access memory (MRAM), and/or spin torque transfer random access memory (STT RAM). As will be discussed in further detail below, in certain embodiments, the system memory 26 may include one or more processor-in-memory (PIM) devices that may be used to internally process instructions stored (e.g., written) into the system memory 26 (although discussed in the context of this embodiment as being used in the system memory 26, a PIM device can also be used in other memory applications and/or system applications).

For example, as will be further appreciated, processing performance may be improved via the PIM device because a processor and/or processing structure may be provided internal and/or near to a memory (e.g., directly on a same chip as the memory array), such as to increase processing performance and/or conserve power in processing, particularly when searching highly parallel data streams (e.g., emails, text, text messages, text documents, text files, script files, text strings, compressed files, webpages, records, binary data, binary files, and so forth) for a data pattern (e.g., bitstrings or strings of text characters). As will be discussed and illustrated with regard to FIGS. 2 and 3 below, the memory device 30 may be referred to as a PIM device 30, and may include both a memory array 32 (FIG. 3) and a processing structure 52 (FIG. 3).

Figure 2:
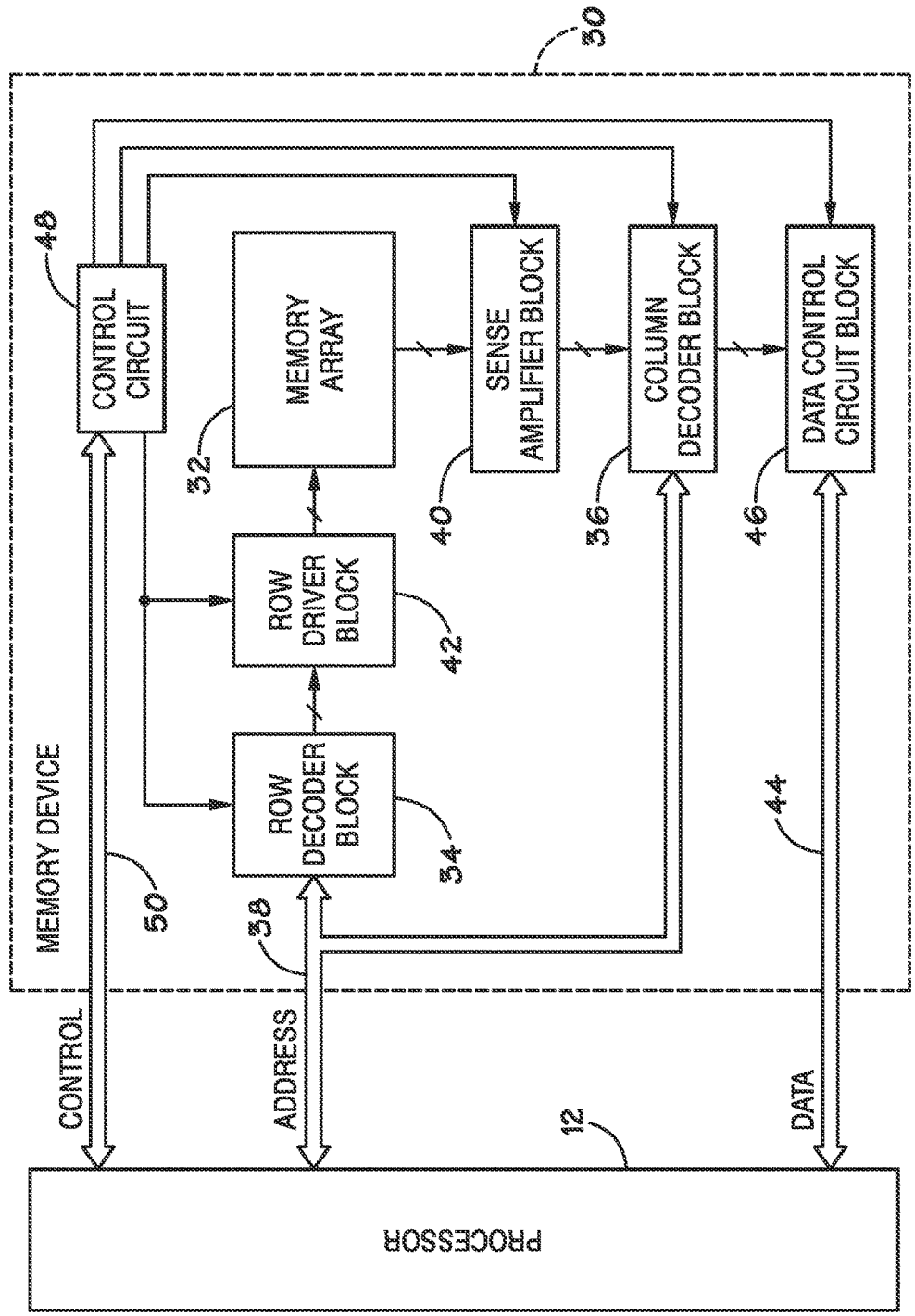
FIG. 2 illustrates a block diagram of the memory device of FIG. 1, in accordance with an embodiment.
Figure 3:
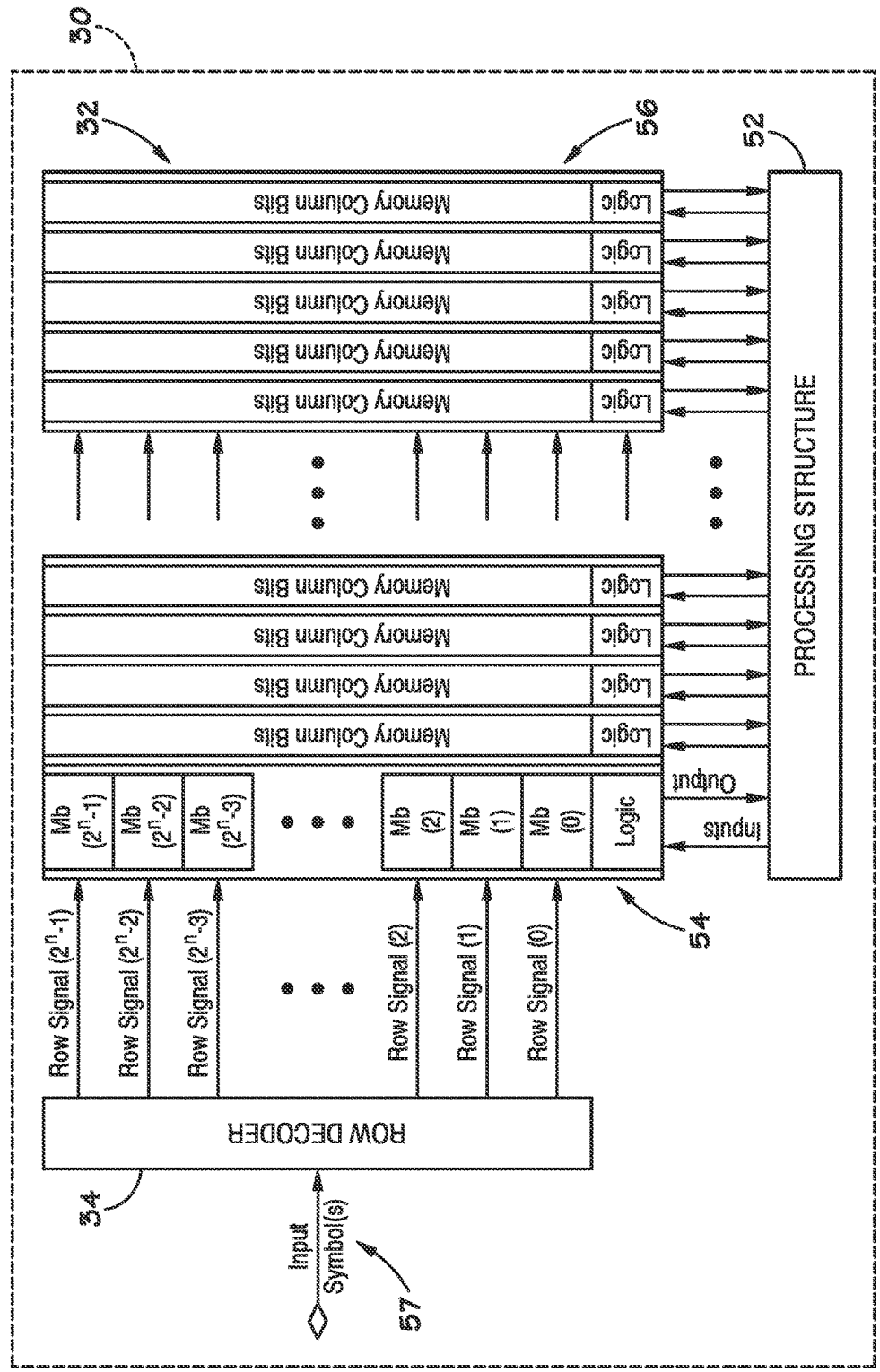
FIG. 3 illustrates a block diagram of a processor-in-memory (PIM) device including a memory array and a processing structure, in accordance with an embodiment.

Turning now to FIG. 2, a block diagram of a memory device 30 that may be included as part of the system memory 26 of FIG. 1 is illustrated. In one embodiment, the memory device 30 may include a DRAM memory device. However, in other embodiments, as previously discussed, the PIM device 30 may include any of various memory devices including, for example, RAM, SRAM, SDRAM, TRAM, NAND flash, NOR flash, PCRAM, RRAM, MRAM, STT RAM, and so forth. As illustrated, the memory device 30 may include a memory array 32. As will be further appreciated, the memory array 32 may include an array of rows (e.g., thousands of rows) and columns (e.g., hundreds of columns) of memory cells that are accessible and sensible by a number of access lines and data lines. The access lines are often referred to as "wordlines" (WL). The data lines are often referred to as "bit lines" (BL) or "digit lines" (DL). The size of the memory array 32 (e.g., the number of memory cells, rows, columns, wordlines and bit/digit lines) may vary between different devices.

As further illustrated, to access the memory array 32, a row decoder block 34 and a column decoder block 36 may be provided to receive and translate address information from the processor 12 via the address bus 38 to access a particular row of memory cells in the memory array 32. A sensing circuit, such as the sense amplifier block 40 including a number of the sense amplifiers, may be also provided between the column decoder 36 and the memory array 32 to sense individual data values stored into the memory cells of the memory array 32. Further, a row driver block 42 may be provided between the row decoder block 34 and the memory array 32 to activate a selected wordline in the memory array according to a given row address.

In certain embodiments, during read and program operations, such as a write operation, data may be transferred to and from the memory device 30 via the data bus 44. The coordination of the data and address information may be conducted through a data control circuit block 46. As further depicted, the memory device 30 may include control circuitry 48 that may be used to receive control signals from the processor 12 via the control bus 50. The control circuitry 48 may be coupled (e.g., communicatively coupled) to each of the row decoder block 34, the column decoder block 36, the sense amplifier block 40, the row driver block 42, and the data control circuit block 46, and may be used to coordinate timing and control among the various circuits included in the memory device 30.

The control circuitry 48 may decode signals provided by control bus 50 from the processor 12. In certain embodiments, these signals may include chip activate signals, write activate signals, and address latch signals that may be used to control operations performed via the memory array 32 such as, for example, data read, data write, and data erase operations. The control circuitry 48 may be responsible for executing instructions from the processor 12. For example, in one embodiment, the control circuitry 48 may include a state machine, a sequencer, or other similar device.

In certain embodiments, the sense amplifier block 40 may include a number of sense amplifiers (e.g., sense amplifier 64 illustrated in FIG. 4) and a number of processing structures (e.g., component), which may include accumulator circuitry and may be used to perform Boolean logical operations (e.g., on data associated with complementary bitlines). For example, as previously noted, the memory device 30 may include a PIM device 30 used to perform arithmetic functions and/or Boolean logical operations to execute instructions. As illustrated by FIG. 3, the memory array 32 may include processing structure 52 (e.g., that may be included as part of the sense amplifier block 40) that may be communicatively coupled to a two-dimensional array of memory cells.

In certain embodiments, the processing structure 52 may be used to perform arithmetic functions and/or Boolean logical operations using data stored into the memory array 32 as inputs and may store the results of the functions and operations back into the memory array 32 without transferring via a bitline address access (e.g., without generating a column decode signal). Thus, the processing structure 52 may perform various arithmetic functions and/or Boolean logical operations on the memory device 30 as opposed to relying on (or exclusively on) processing resources external to the memory device 30 (e.g., by the processor 12). For example, the processing structure 52 may include arithmetic logic unit (ALU) circuitry, floating point unit (FPU) circuitry, and/or a combinational logic blocks that may be used to execute instructions by performing arithmetic functions such as, for example, addition, subtraction, multiplication, and division, as well as Boolean logical operations such as, for example, AND, OR, NOT, NAND, NOR, and XOR, sum-of-products (SoP), and products-of-sums (PoS) Boolean logical operations on data (e.g., one or more operands).

In certain embodiments, as further illustrated in FIG. 3, the row decoder 34 and/or the column decoder 36 may receive one or more input symbols 57 (e.g., 8-bit symbols, 16-bit symbols, 32-bit symbols, 64-bit symbols, and so on). The row decoder 34 may then decode the one or more input symbols 57 (e.g., address signals) and provide one or more input symbols 57 (e.g., data streams) to the respective columns 56 of the memory array 32. However, instead of performing a separate or external column address and decode operation, the processing structure 52 may perform the arithmetic functions and/or logical operations. As will be further appreciated, the processing structure 52 of the memory device 30 may be used to provide a high-performance search (e.g., scanning) of the data streams (e.g., text document, text file, text script) stored into the columns 56 to compare a number of digits in a data pattern (e.g., text or characters of the text document text document, text file, or text script) to the data streams stored into the columns of the PIM device 30. For example, this comparison may be executed in parallel across all columns 56 of the memory array 32, and the results may be stored, for example, into a success indicator row of the PIM device 30.

Figure 4:
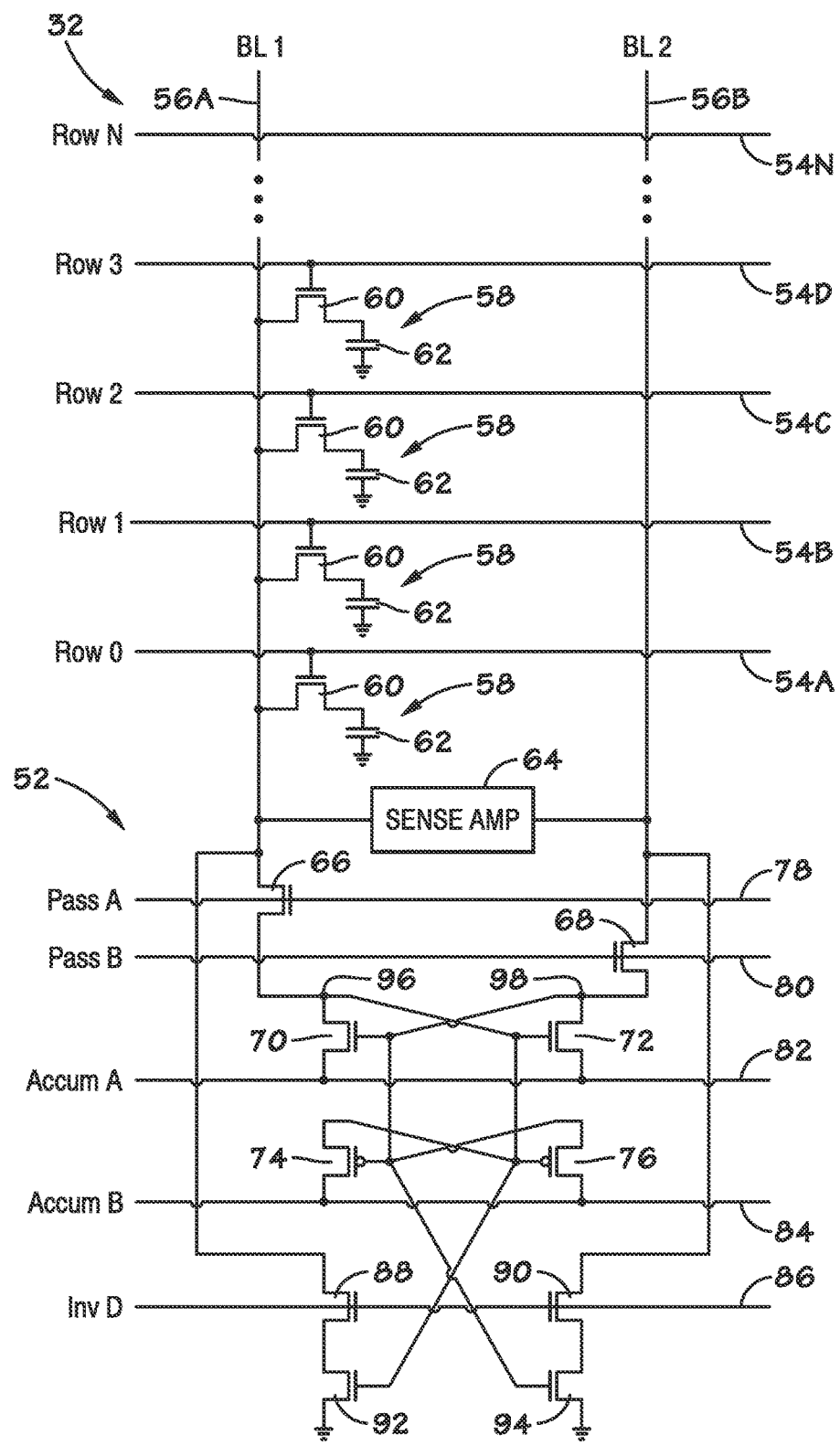
FIG. 4 is component-level circuit diagram of a portion of an array and processing structure of the PIM device of FIG. 3, in accordance with an embodiment.

Turning now to FIG. 4, a component-level illustration (e.g., equivalent circuit) of the memory array 32 and the processing structure 52 of one example of a PIM device 30 is depicted. As previously discussed, in one embodiment, the memory array 32 may include a DRAM memory array, in which each memory cell 58 may include an access device 60 (e.g., a transistor) and a storage element 62 (e.g., a capacitor). As further illustrated, and as previously discussed above with respect to FIG. 3, the cells 58 of the memory array 32 may be arranged in rows coupled by wordlines 54A (e.g., "Row0"), 54B (e.g., "Row1"), 54C (e.g., "Row2"), 54D (e.g., "Row3"), up to, for example, 54N (e.g., "RowN"). The memory array 32 may also include columns of memory cells 58 coupled by bitlines 56A (e.g., "BL1") and 56B (e.g., "BL2"). In an embodiment, each column of cells 58 may be associated with a pair of complementary bitlines 56A and 56B.

Although only a single column of memory cells 58 is illustrated in FIG. 4, it should be appreciated that the memory array 32 may include any number of columns (e.g., 1,024, 2,048, 4,096, 8,192, 16,384, or more columns) of memory cells 58 and/or bitlines 56A and 56B. A gate of a particular memory cell transistor 60 may be coupled to a corresponding wordline 54A, 54B, 54C, 54D, and up to 54N, a first source/drain region may be coupled to a corresponding bitline 56A, and a second source/drain region of a particular memory cell transistor may be coupled to a corresponding capacitor 62. Furthermore, although not illustrated in FIG. 4, the bitline 56B may be also coupled to a separate column of memory cells 58.

In certain embodiments, as previously discussed, the memory array 32 may be coupled to the sense amplifier block 40. The sense amplifier block 40 may include a sense amplifier 64 and a processing structure 52. The sense amplifier 64 may be coupled to the complementary bitlines 56A and 56B corresponding to a particular column of memory cells 58. The sense amplifier 64 may be used to determine a state (e.g., logic data value) stored into a selected cell 58. For example, in one embodiment, the sense amplifier 64 may include one or more current-mode sense amplifiers and/or single-ended sense amplifiers (e.g., sense amplifier 64 coupled to one bitline).

In certain embodiments, as further illustrated in FIG. 4, the processing structure 52 (e.g., PIM device) may include a number of transistors formed on pitch with the transistors of the sense amplifier 64 and/or the memory cells 58 of the memory array 32. The pitch may conform to a particular feature size such as, for example, $4F^2$, $6F^2$, and so forth. In some embodiments, the processing structure 52 may operate (e.g., alone or in conjunction with the sense amplifier 64) to perform various arithmetic functions (e.g., addition, subtraction, multiplication, division, and so forth) and Boolean logical operations (e.g., AND, OR, NOT, NAND, NOR, and XOR, sum-of-products (SoP), products-of-sums (PoS)) using data from the memory array 32 as input and store the result back into the memory array 32 without necessarily transferring the data via a bitline address access to, for example, the external processor 12.

Figure 5:
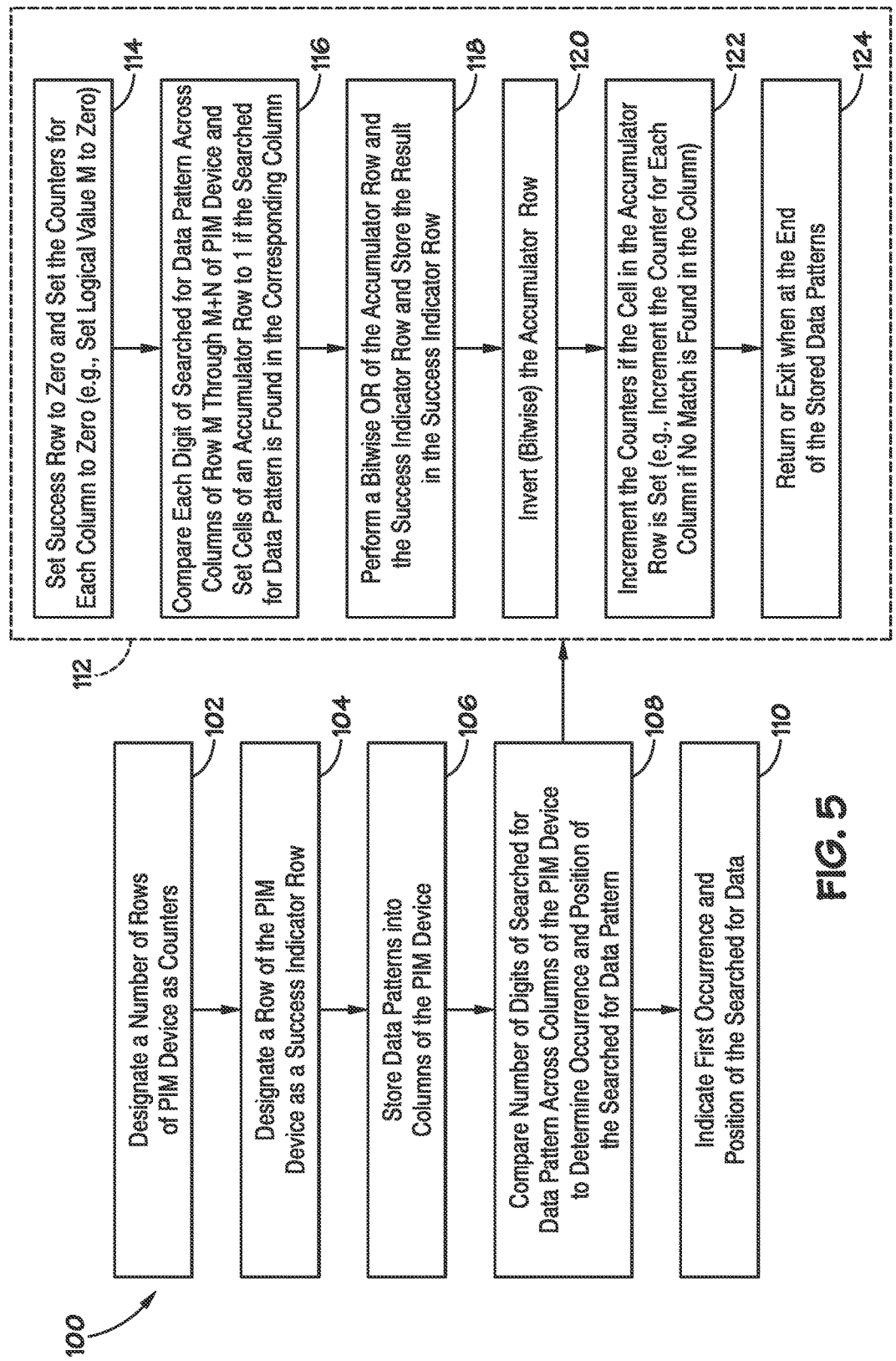
FIG. 5 is a flowchart illustrating an embodiment of a process useful in searching highly parallel data streams for one or more data patterns by using the PIM device of FIG. 3, in accordance with an embodiment.
Figure 6:
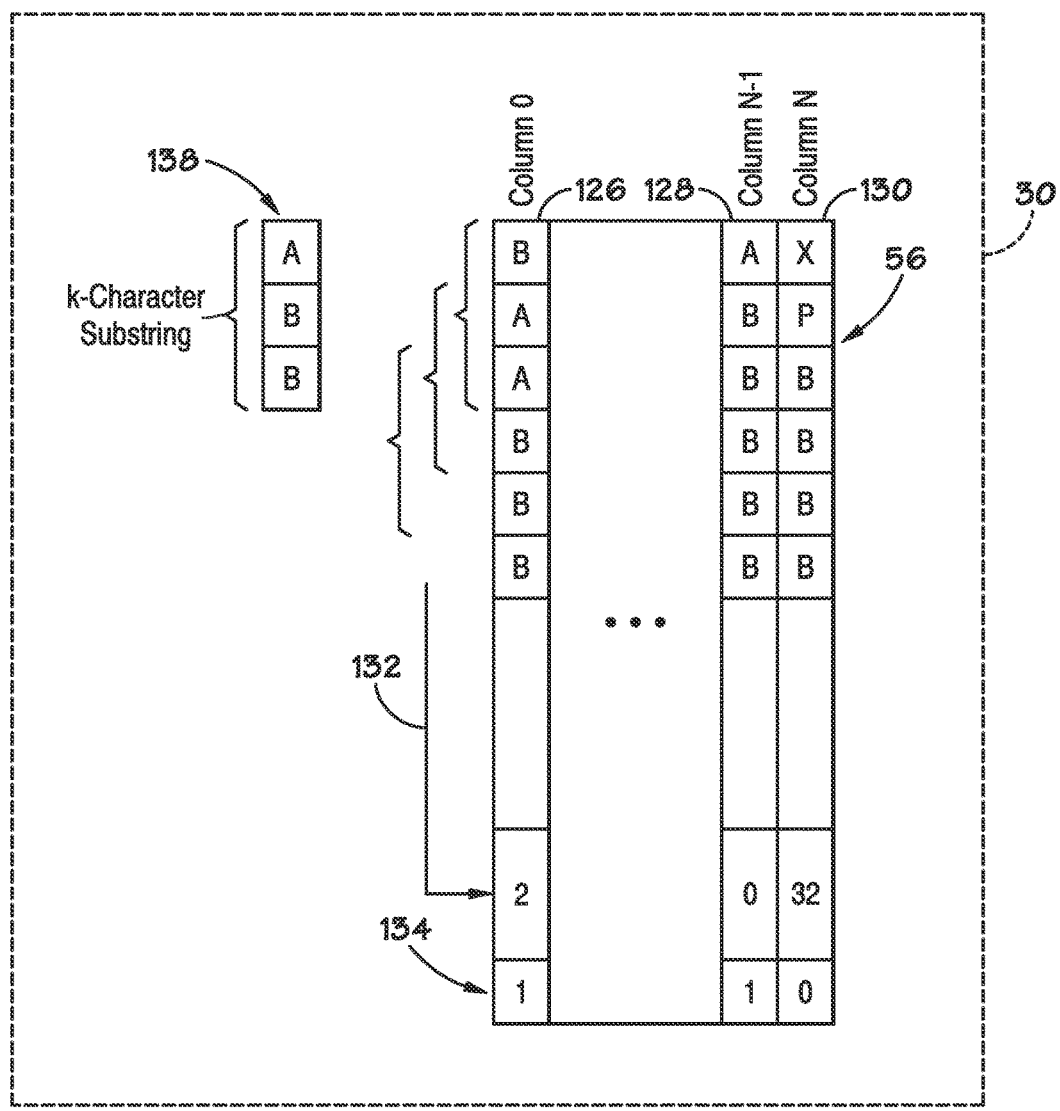
FIG. 6 is an illustration of the process of FIG. 5 implemented on the PIM device of FIG. 3, in accordance with an embodiment.

For example, as will be further appreciated with respect to FIGS. 5 and 6, the processing structure 52 of the PIM device 30 may be used to search highly parallel data streams in parallel across columns of the memory array 32. For example, as will be further appreciated, the processing structure 52 of the PIM device 30 may be used to speedily (e.g., at a rate of approximately 16 gigabytes per second (GB/sec)) and efficiently perform a text search of a number (e.g., thousands or millions) of emails, text, text messages, text documents, text files, script files, text strings, compressed files, webpages, records, binary data, binary files, and so forth.

In certain embodiments, as further illustrated in FIG. 4, the processing structure 52 may include a number of transistors 66 and 68 coupled to each of the bitlines 56A and 56B. The transistors 66 and 68 may include a first terminal (e.g., source and/or drain) that may be coupled to the bitlines 56A and 56B, respectively, and a second terminal (e.g., source and/or drain) coupled to an accumulator circuitry (e.g., cross-coupled transistors 70, 72, 74, and 76). In some embodiments, the transistors 66 and 68 may be pass transistors, which may be activated via respective signals 78 (e.g., PASS A) and 80 (e.g., PASS B) in order to pass the voltages and/or currents on the respective bitlines 56A and 56B to the inputs of the accumulator circuitry. As depicted, the accumulator circuitry may include a cross coupled latch including, for example, cross coupled NMOS transistors 70 and 72 and cross coupled PMOS transistors 74 and 76. For example, the accumulator circuitry may be provided to perform one or more accumulate operations on data values of, for example, the bitlines 56A and 56B.

In certain embodiments, a source/drain region of transistor 70 and 72 may be commonly coupled to a negative signal 82 (e.g., ACCUM A). Similarly, a source/drain region of transistors 74 and 76 may be commonly coupled to a positive signal 84 (ACCUM B). The signal 84 (e.g., ACCUM B) may include a supply voltage (e.g., $V_{CC}$), while the signal 82 may include a reference voltage (e.g., a low voltage or ground). Specifically, the signals 82 and 84 may be provided to activate the accumulator circuitry. The activated accumulator circuitry may operate to amplify a differential voltage between common node 96 and common node 98, such that nodes 96 and 98 may be respectively driven to one of the signals 82 (e.g., ACCUM A) and 84 (e.g., ACCUM B). The processing structure 52 may also include inverting transistors 88 and 90 having a first source/drain region coupled to the respective bitlines 56A and 56B, and a second source/drain region coupled to a first source/drain region of transistors 92 and 94 to perform, for example, NOT Boolean logical operations. As further depicted, the gates transistors 88 and 90 may be coupled to a signal 86 (e.g., "InvD") that may be provided to invert one or more data values along the bitlines 56A and 56B.

In certain embodiments, as previously noted, it may be useful to utilize the processing structure 52 (e.g., PIM device) to search highly parallel data streams (e.g., text document, text file, text script) for a given data pattern (e.g., text within the text document, text file, or text script). For example, as will be further appreciated, the processing structure 52 of the PIM device 30 may compare a fixed number of digits (e.g., bits) in a data pattern to portions of data streams stored (column-wise) into a contiguous set of rows 54 in the PIM device 30.

In certain embodiments, such a comparison may be executed in parallel (e.g., concurrently) across all columns 56 of the memory array 32, and the results may be stored into a success indicator row of the PIM device 30. Thus, separate streams of data (e.g., emails, text, text messages, text documents, text files, script files, text strings, compressed files, webpages, records, binary data, binary files, and so forth) may be stored and searched in separate columns 56 of the PIM device 30. In this way, the results of the search may be provided for every data stream in the corresponding column 56 of the success indicator row, and may thus allow the comparison and search of, for example, thousands or millions of data streams (e.g., emails, text, text messages, text documents, text files, script files, text strings, compressed files, webpages, records, binary data, binary files, and so forth) in parallel (e.g., concurrently).

Turning now to FIG. 5, a flow diagram is presented, illustrating an embodiment of a process 100 (and sub-process 112) useful in searching highly parallel data streams for one or more data patterns by using, for example, the processor-in-memory (PIM) device 30 (e.g., memory array 32 and processing structure 52) included within the processor-based system 10 and depicted, for example, in FIGS. 3 and 4. The process 100 may include instructions (e.g., code) stored into a non-transitory machine-readable medium (e.g., the PIM device 30 and/or the memory array 32 of the PIM device 30) and executed, for example, by the processing structure 52 of the PIM device 30 and/or in combination with the data control circuit block 46 and/or control circuit 48. For the purpose of illustration, henceforth, FIG. 5 may be discussed in conjunction with FIG. 6. Furthermore, while the discussion of FIGS. 5 and 6 may be directed toward the behavioral synthesis (e.g., register transfer level (RTL) configuration) of the PIM device 30 to search highly parallel data streams for one or more data patterns, for example, it should be appreciated that the physical synthesis (e.g., physical layout generation and construction) of the PIM device 30 may, in one or more embodiments, correspond to the component-level equivalent circuit of the memory array 32 and the processing structure 52 depicted in FIG. 4.

With the foregoing in mind, the process 100 may begin with the PIM device 30 designating (block 102) respective columns of memory cells in each of a number of rows of memory cells as counters. For example, as illustrated in FIG. 6, a plurality of data streams may be stored vertically into the columns 126 (e.g., "Column 0"), 128 (e.g., "Column N−1"), and 130 (e.g., "Column N") of the PIM device 30, and a number of the rows 132 (e.g., the first n rows "Row0" through "Row n") of the PIM device 30 may be designated as counter rows. Each memory cell corresponding to the counter rows 132 may be initialized to a logical value of "0." The process 100 may then continue with the PIM device 30 designating (block 104) a row of memory cells of the PIM device as a success indicator row (e.g., data search match indication row).

For example, as illustrated in FIG. 6, an additional row 134 of memory cells of the PIM device 30 may be used to indicate when at least a respective digit (e.g., a character or bits) of a searched for data pattern (e.g., one or more characters of an email, a text, a text message, a text document, a text file, a script file, a text string, a compressed file, a webpage, and so forth) is found in the data stored into the one or more of the columns 126, 128, and 130. For example, in one embodiment, the row 134 (e.g., "Row n+1") of the PIM device 30 may be designated as the success indicator row (e.g., data search match indication row). The success indicator row 134 may be initialized to a logical value of "0" and may change to a logical value of "1" when the searched for data pattern is detected in the corresponding column as illustrated in FIG. 6. The process 100 may then continue with the PIM device 30 storing (block 106) data patterns into columns of the PIM device. For example, as previously noted and as illustrated in FIG. 6, the PIM device 30 may receive and store data patterns vertically into columns 126 (e.g., "Column 0"), 128 (e.g., "Column N−1"), and 130 (e.g., "Column N") of the PIM device 30.

In certain embodiments, the PIM device 30 may store the data patterns into memory cells of each of the columns 126, 128, and 130, such memory cells being separate from those corresponding to the counter rows 132, success indicator row 134, and row of accumulators. The process 100 may then continue with the PIM device 30 comparing (block 108) a number of digits (e.g., bits) of a searched for data pattern across all or a subset of columns of the PIM device 30 to detect an occurrence and/or position of the searched for data pattern in the stored data patterns.

Indeed, as illustrated in FIG. 6, and as will be further appreciated, the PIM device 30 may perform a sub-process 112 (FIG. 5) to compare a k number of digits of a data pattern 138 (e.g., "ABB") to the data stored into the memory cells of one or more contiguous rows 54 in one or more columns 126, 128, and 130 of memory cells of the PIM device 30. The comparison may be executed across all or a subset of columns 126 (e.g., "Column 0"), 128 (e.g., "Column N−1"), and 130 (e.g., "Column N") of the PIM device 30 in parallel (e.g., concurrently), and the results may be then stored into a success indicator row 134 of the PIM device 30. The process 100 may then conclude with the PIM device 30 indicating (block 110) the occurrence and/or position of the searched for data pattern in the stored data patterns when a match (e.g., "hit") of the searched for data pattern is detected.

In certain embodiments, as previously noted above, the step of comparing the number of digits (e.g., bits) of the data pattern to the data stored into the columns (e.g., columns 126, 128, and 130) of the PIM device 30 and determining an occurrence and/or position of the data pattern in the stored data as illustrated by block 108 may include performing a sub-process 112 as further depicted in FIG. 5. The sub-process 112 may carried out by the execution of instructions (e.g., code) that are stored into a non-transitory machine-readable medium (e.g., the PIM device 30 and/or the memory array 32 of the PIM device 30) and executed, for example, by the processing structure 52 of the PIM device 30 and/or in combination with the data control circuit block 46 and/or control circuit 48.

The sub-process 112 may begin with the PIM device 30 setting (block 112) the memory cells of the success indicator row 134 to a first logical value (e.g., setting logical value M to a logical value of "0"). In some embodiments, a for-loop may then be executed, for example, from 0 to N, in which N may represent the length of the longest stored data pattern. Accordingly, a counter, C (e.g., a software or firmware implemented counter), associated with the for-loop, may also be initialized to a logical value of 0.

The sub-process 112 may then continue with the PIM device 30 comparing (block 116) each digit of the searched for data pattern across all or a subset of columns of the PIM device 30 (e.g., across columns of row M through row M+n) and set the memory cells of the accumulator row to a logical value of "1" if the searched for data pattern is detected in the corresponding column. For example, an inner for-loop (e.g., within the initial for-loop) may be executed from, for example, J=0 to k, where k may represent the length of the searched for data pattern (e.g., data pattern 138). The J$^{th}$ bit of the data pattern 138 may be then compared to the bits in row C+J, and the initial logical value of a respective accumulator may be replaced with the result of a logical AND operation of the result of the comparison for the corresponding column and the initial logical value. As an example, in one or more embodiments, the described block 116 may be executed as:

Comment: "start" is initial row number where inputs are located.
Comment: "pat" is the data pattern searched for
Comment: "bits" is the number of bits in the searched for pattern Comment: The result is placed in accumulator, and hence the result may be copied to some other row number (as generally discussed above)

```
Boolean first = TRUE;
for (unsigned int i = 0; i < bits; i++) {
    if ((pat >> i) & 1) {
        if (first) {
            copy row number(start + i) to accumulator
        } else {
            accumulator = accumulator BITWISE_AND row number(start + i)
        }
    } else {
        if (first) {
            accumulator = BITWISE_INVERT(row number(start + i))
        } else {
            accumulator = BITWISE_INVERT(row number(start + i)) BITWISE_AND accumulator
        }
    }
    first = FALSE;
}
if (first) {
    set all bits in accumulator to 1 (trivial case of zero-length pattern)
}.
```

The sub-process 112 may then continue with the PIM device 30 performing (block 118) a logical operation on the values of the row of accumulators and the values of the success indicator row 134 (e.g., data search match indication row) and storing the corresponding memory cells of the success indicator row 134. For example, referring again to FIG. 6, the PIM device 30 may perform a bitwise OR logical operation of the respective logical values of the row of accumulators corresponding to each of the respective columns 126, 128, and 130 with the logical values stored into the corresponding memory cells of the success indicator row 134. The result of the aforementioned operation may be then stored into the corresponding memory cells of the success indicator row 134.

The sub-process 112 may then continue with the PIM device 30 inverting (block 120) the values stored into the row of accumulators, and store the respective resultant values to the respective accumulators (e.g., the individual memory cells and/or circuitry of the columns corresponding to the row of accumulators). For example, the PIM device 30 may perform a bitwise NOT operation (e.g., an inversion) of the values stored into the row of accumulators, and store the respective resultant inverted values into the respective accumulators of the row of accumulators such that each of the individual memory cells and/or circuitry of the row of accumulators corresponding to respective columns 126, 128, and 130 in which a successful match (e.g., a "hit") of the data pattern 138 has been detected stores a logical value of "0."

The sub-process 112 may then continue with the PIM device 30 incrementing (block 122) the rows of counters if the corresponding memory cells of the accumulator row are set. In other words, a respective counter is incremented if a corresponding accumulator of the accumulator row is set (e.g., if no match is found), but is not incremented if the corresponding accumulator of the accumulator row is not set.

For example, the PIM device 30 may perform an addition arithmetic function based on the value of the respective accumulators (e.g., the individual memory cells and/or circuitry of the columns corresponding to the row of accumulators) and the value of the respective counters in the counter rows 132 corresponding, for example, to each of the respective columns 126 (e.g., "Column 0"), 128 (e.g., "Column N−1"), and 130 (e.g., "Column N"). The sub-process 112 may then conclude with the PIM device 30 returning (block 124) or exiting the sub-process 112 when a complete stored data pattern is searched. For example, the value of the counter, C may be incremented, and when M=M+n+1 (e.g., next character), the sub-process 112 may return to block 116 and repeat the discussed process.

Indeed, as will be further discussed below with respect to the examples provided in FIG. 6, when respective memory cells of the success indicator row 134 store a logical value of "1" (e.g., indicating a successful match of the data pattern 138), the corresponding counters in the counter rows 132 may store a value (e.g., "2," "0," "32") indicating the position of the first occurrence of the detected data pattern 138 (e.g., "ABB") in one or more of the respective columns 126 (e.g., "Column 0"), 128 (e.g., "Column N−1"), and 130 (e.g., "Column N") when a match (e.g., a "hit") or a successful match (e.g., a "hit") of the data pattern 138 is detected, or otherwise the number of iterations of performed search and comparison. On the other hand, when a successful match (e.g., a "hit") of the data pattern 138 (e.g., "ABB") is not detected in one or more of the respective columns 126 (e.g., "Column 0"), 128 (e.g., "Column N−1"), and 130 (e.g., "Column N"), the memory cells of the success indicator row 134 respectively corresponding to the columns where the data pattern was not detected may be set to a logical value of "0."

As a further example, referring again to FIG. 6, according to one or more embodiments, once a successful match (e.g., a "hit") of the searched for data pattern 138 (e.g., "ABB") is detected in any of the columns 126 (e.g., "Column 0"), 128 (e.g., "Column N−1"), and 130 (e.g., "Column N"), the counter corresponding to that column may not be incremented again. Thus, in certain embodiments, the values in each of the counters may indicate the position of the first occurrence of the searched for data pattern 138 (e.g., "ABB") in the data stored into the respective columns 126 (e.g., "Column 0"), 128 (e.g., "Column N−1"), and 130 (e.g., "Column N").

For example, as illustrated in FIG. 6, the numbers "2" and "0" respectively indicate that the data pattern 138 (e.g., "ABB") has been detected after 2 increments (e.g., after 2 iterations of a search) in a vertical direction down the column 126 (e.g., "Column 0"), and on the first increment (e.g., on the first iteration of a search) in a vertical direction down the column 128 (e.g., "Column N−1"), respectively. The number "32" indicate that the data pattern 138 (e.g., "ABB") was not detected after 32 increments (e.g., after 32 iterations of a search assuming a 32 digit stored data pattern) in a vertical direction down the column 130 (e.g., "Column N"). In this way, the results of the search may be provided for each respective data stream in the corresponding columns 126 (e.g., "Column 0"), 128 (e.g., "Column N−1"), and 130 (e.g., "Column N"), and may thus allow the search of thousands or millions of data streams in parallel (e.g., concurrently).

While the invention may be susceptible to various modifications and alternative forms, specific embodiments have been illustrated by way of example in the drawings and have been described in detail herein. However, it should be understood that the invention may be not intended to be limited to the particular forms disclosed. Rather, the invention may be to cover all modifications, equivalents, and alternatives falling within the spirit and scope of the invention as defined by the following appended claims.

What is claimed is:

1. A method, comprising:
   iteratively comparing, via a processor in memory, a data pattern comprising a number of digits with data stored into a plurality of rows in each of a plurality of columns of memory cells, wherein the number of digits is equal to a first number of rows in the plurality of rows, wherein the first number of rows is less than a total number of rows in each of the plurality of columns, and wherein the data pattern is iteratively compared to the plurality of rows in parallel for each column in the plurality of columns, and wherein the processor in memory is coupled to each of the plurality of columns of memory cells; and
   in response to detecting the data pattern in the data stored into a particular column of memory cells of the plurality of columns of memory cells, storing, via the processor in memory, a value indicative of at least one of an occurrence of the data pattern or a position of the data pattern in the data stored into the particular column in a memory cell of the particular column, wherein the value corresponds to a total number of digits searched within the particular column of the plurality of columns before a first occurrence of the data pattern.

2. The method of claim 1, comprising storing a plurality of data sequences as the data into the plurality of columns of memory cells.

3. The method of claim 1, comprising initializing a row of a plurality of memory cells as a row of counters, and wherein each memory cell of the initialized row corresponds to a respective one of the plurality of columns of memory cells.

4. The method of claim 3, wherein initializing the row of counters comprises initializing a set of rows as rows of counters.

5. The method of claim 3, comprising initializing another row of the plurality of memory cells as a success indicator row, wherein the success indicator row is configured to indicate the occurrence of the data pattern.

6. The method of claim 1, wherein storing in the memory cell of the particular column the value comprises:
   comparing the number of digits of the data pattern to data stored into contiguous rows of the plurality of rows in each column of the plurality of columns; and
   storing a respective result of the comparison into a respective memory cell of a respective column of the plurality of columns, wherein each respective memory cell of each respective column corresponds to a row of accumulators.

7. The method of claim 6, comprising initializing the row of accumulators to a first logical value, and wherein comparing the number of digits of the data pattern to the data stored into the contiguous rows comprises:
   performing a for-loop to compare each digit of the data pattern across at least a subset of the plurality of columns of memory cells; and
   storing a result of a logical AND operation of a result of the comparison and the first logical value to a respective accumulator of the row of accumulators corresponding to the particular column of memory cells.

8. The method of claim 7, comprising:
   performing a first logical operation on the result stored into the respective accumulator and an initial value stored into the memory cell of the particular column, wherein storing a value in a memory cell of the particular column indicative of the occurrence of the data pattern comprises storing a second result of the first logical operation in the memory cell of the particular column; and performing a second logical operation on the result stored into the respective accumulator; and storing a third result of the second logical operation in the respective accumulator.

9. The method of claim 8, wherein storing a value in the memory cell of the particular column indicative of the position of the data pattern comprises adding the third result of the second logical operation to an initialized value of a plurality of memory cells.

10. A processor-in-memory (PIM) device, comprising:
a plurality of memory cells arranged in a plurality of rows and a plurality of columns; and
a processing structure communicatively coupled to the plurality of memory cells, wherein the processing structure is configured to:
iteratively compare a number of digits of a data pattern to data stored into the plurality of rows in each of the plurality of columns of the plurality of memory cells, wherein the number of digits is equal to a first number of rows in the plurality of rows, wherein the first number of rows is less than a total number of rows in each of the plurality of columns, and wherein the data pattern is iteratively compared to the plurality of rows in parallel for each column in the plurality of columns, and wherein the processing structure is coupled to each of the plurality of columns;
detecting the data pattern in the data stored into a particular column of the plurality of columns;
storing a value into a memory cell of the particular column, wherein the value is indicative of an occurrence of the data pattern in the particular column, wherein the value corresponds to a total number of digits searched within the particular column of the plurality of columns before a first occurrence of the data pattern.

11. The PIM device of claim 10, wherein the value corresponds to an indication of whether or not the data pattern is detected within the particular column of memory cells.

12. A method for searching data, comprising:
initializing, via a processor in memory, a subset of rows of a plurality of rows of memory cells as counter rows;
initializing, via the processor in memory, a first row of the plurality of rows of memory cells as a success indicator row;
iteratively comparing, via the processor in memory, each digit of a data pattern across a plurality of columns of the memory cells, wherein the data pattern comprises a number of digits that is less than a total number of rows in each column of the plurality of columns, wherein the processor in memory is coupled to each of the plurality of columns of memory cells, and wherein iteratively comparing each digit of the data pattern comprises:
executing a for-loop from 0 to N, wherein N comprises a length of the data; and
generating a counter C by which to execute the for-loop, wherein the counter C is initialized to value of 0;
storing, via the processor in memory, a binary value in a respective accumulator of a row of accumulators, wherein the respective accumulator corresponds to a respective column of the plurality of columns where each digits of the data pattern is detected;
executing, via the processor in memory, a first logical operation on the binary value and a value stored into a corresponding memory cell of the success indicator row;
storing, via the processor in memory, a first result of the first logical operation into the corresponding memory cell of the success indicator row;
executing, via the processor in memory, a second logical operation on the first result stored into the corresponding memory cell of the success indicator row;
storing, via the processor in memory, a second result of the second logical operation into the respective accumulator of the row of accumulators; and
changing a value stored into a respective counter corresponding to the particular column in the counter rows based on the second result.

13. The method of claim 12, comprising:
executing a second for-loop from: J=0 to k, wherein k comprises a length of the data pattern; and
comparing the $J^{th}$ digit of the data pattern to digits of C+k rows storing the data to find a match of the data pattern, wherein comparing the $J^{th}$ digit comprises comparing each digit of the data pattern.

14. The method of claim 12, wherein executing the second logical operation comprises executing a logical bitwise OR operation of the first result and an initial value of the corresponding memory cell of the success indicator row.

15. The method of claim 14, wherein executing the second logical operation comprises executing a logical bitwise NOT operation on the first result to invert the first result.

16. A non-transitory computer-readable medium having computer executable code stored thereon, the code comprising instructions configured to, when executed by a processor, cause the processor to:
iteratively compare a data pattern comprising a number of digits with data stored into a plurality of rows in each of a plurality of columns of memory cells, wherein the number of digits is equal to a first number of rows in the plurality of rows, wherein the first number of rows is less than a total number of rows in each of the plurality of columns, and wherein the data pattern is iteratively compared to the plurality of rows in parallel for each column in the plurality of columns, and wherein the processor is coupled to each of the plurality of columns of memory cells;
detect an occurrence of the data pattern in a particular column of the plurality of columns; and
store a value indicative of a position of the data pattern in a particular column in a respective memory cell of the particular column, wherein the value comprises a total number of digits searched within the particular column of the plurality of columns before a first occurrence of the data pattern in the particular column.

17. The non-transitory computer-readable medium of claim 16, wherein the instructions, when executed by the processor, is configured to cause the processor to store a second value indicative of the occurrence of the data pattern in the particular column in a second respective memory cell of the particular column.

* * * * *